(12) United States Patent
LeBlanc et al.

(10) Patent No.: US 8,645,144 B2
(45) Date of Patent: Feb. 4, 2014

(54) AUDIO SIGNAL SHAPING FOR PLAYBACK BY AUDIO DEVICES

(75) Inventors: Wilfrid LeBlanc, Vancouver (CA); Taro Umezawa, New Westminster (CA)

(73) Assignee: Broadcom Corporation, Irvine, CA (US)

( * ) Notice: Subject to any disclaimer, the term of this patent is extended or adjusted under 35 U.S.C. 154(b) by 1310 days.

(21) Appl. No.: 12/109,017

(22) Filed: Apr. 24, 2008

(65) Prior Publication Data

US 2009/0271186 A1  Oct. 29, 2009

(51) Int. Cl.
*G10L 19/00* (2013.01)

(52) U.S. Cl.
USPC ........... 704/500; 704/205; 381/104; 381/107; 381/108

(58) Field of Classification Search
USPC ........... 704/205, 500, E19.015; 381/104–109
See application file for complete search history.

(56) References Cited

U.S. PATENT DOCUMENTS

| | | | |
|---|---|---|---|
| 4,713,624 A * | 12/1987 | Smith | 330/118 |
| 4,982,435 A * | 1/1991 | Kato et al. | 381/102 |
| 5,675,656 A * | 10/1997 | Sondermeyer et al. | 381/61 |
| 5,930,373 A * | 7/1999 | Shashoua et al. | 381/98 |
| 5,987,407 A * | 11/1999 | Wu et al. | 704/200.1 |
| 6,195,029 B1 * | 2/2001 | Urry et al. | 341/138 |
| 6,493,657 B1 * | 12/2002 | Godfrey et al. | 702/198 |
| 6,594,368 B2 * | 7/2003 | Finn | 381/111 |
| 6,848,012 B2 * | 1/2005 | LeBlanc et al. | 710/52 |
| 6,928,495 B2 * | 8/2005 | LeBlanc et al. | 710/52 |
| 7,165,130 B2 * | 1/2007 | LeBlanc et al. | 710/52 |
| 7,283,585 B2 * | 10/2007 | LeBlanc et al. | 375/222 |
| 7,333,475 B2 * | 2/2008 | LeBlanc et al. | 370/352 |
| 7,409,056 B2 * | 8/2008 | LeBlanc et al. | 379/399.01 |
| 7,415,120 B1 * | 8/2008 | Vaudrey et al. | 381/109 |
| 7,466,829 B1 * | 12/2008 | Anderson | 381/103 |
| 2002/0114474 A1 * | 8/2002 | Finn | 381/111 |
| 2002/0172378 A1 * | 11/2002 | Bizjak | 381/106 |
| 2003/0023429 A1 * | 1/2003 | Claesson et al. | 704/201 |
| 2004/0138769 A1 * | 7/2004 | Akiho | 700/94 |
| 2006/0126865 A1 * | 6/2006 | Blamey et al. | 381/102 |
| 2007/0136050 A1 * | 6/2007 | Tourwe | 704/205 |
| 2008/0212799 A1 * | 9/2008 | Breitschadel | 381/106 |
| 2008/0218259 A1 * | 9/2008 | Gallo | 330/110 |
| 2009/0116664 A1 * | 5/2009 | Smirnov et al. | 381/106 |
| 2009/0245539 A1 * | 10/2009 | Vaudrey et al. | 381/109 |
| 2009/0281805 A1 * | 11/2009 | LeBlanc et al. | 704/233 |

\* cited by examiner

*Primary Examiner* — Vijay B Chawan
(74) *Attorney, Agent, or Firm* — Fiala & Weaver P.L.L.C.

(57) ABSTRACT

A technique is provided for limiting distortion of an audio signal being processed for playback by an audio device. In accordance with the technique, the audio signal is compressed to generate a compressed audio signal having a level that does not exceed a compression limit. The compressed audio signal is then soft clipped signal to generate a soft-clipped audio signal having a level that does not exceed a soft clipping limit, wherein the compression limit exceeds the soft clipping limit. The technique may also include passing the audio signal through a shaping filter prior to compressing the audio signal, wherein passing the audio signal through a shaping filter comprises modifying the level of selected frequency components of the audio signal.

21 Claims, 13 Drawing Sheets

AUDIO SIGNAL SHAPING FOR PLAYBACK BY AUDIO DEVICES

BACKGROUND OF THE INVENTION

Field of the Invention

The invention generally relates to the processing of an audio signal by an audio device for playback to a user.

BACKGROUND

Conventional audio devices that process an audio signal for playback to a user typically process the audio signal in stages. Each of these stages may limit the dynamic range of the audio signal. For example, in a stage that processes a digital version of the audio signal, the dynamic range may be limited due to the audio bit depth used to digitally represent samples of the audio signal. As another example, in a stage that processes an analog version of the audio signal, the dynamic range may be limited due to voltage and current limits associated with an amplifier that comprises part of the stage.

When a user increases the playback volume of an audio device, the dynamic range of the audio signal is increased. If the dynamic range of the audio signal is increased to a point at which it exceeds the limits associated with any of the processing stages, distortion of the audio signal may result. For example, in the absence of any logic to address such over-driving of a processing stage, hard clipping of the audio signal may result. In hard clipping, the portions of the audio signal that cannot be passed or represented by the processing stage (typically the peaks and troughs of the audio waveform in the time domain) are simply cut off. Such hard clipping distorts the audio waveform and creates strong harmonics in the high-frequency range, thereby degrading the quality of the audio signal as perceived by the user. If the audio signal is a speech signal, the intelligibility of the speech signal will suffer.

The foregoing problem is especially prevalent in portable audio devices where components are required to be small and power consumption is limited to preserve battery life. In such audio devices, amplification of the analog representation of the audio signal is limited. To compensate for this, the components that process a digital representation of the audio signal are often over-driven to achieve audio playback at increased volumes, thereby resulting in distortion of the audio signal. Consequently, users of such devices are forced to make a choice between decreasing the volume of the audio signal, which may not be desirable (particularly in noisy environments where the audio is already difficult to hear), or increasing the volume and tolerating the distortion.

What is needed, then, is a system and method that allows an audio device to increase the volume of an audio signal being played back to a user in a manner that preserves the perceived quality and intelligibility of the audio signal even when the dynamic range of the audio signal exceeds limits associated with one or more processing stages within the audio device.

BRIEF SUMMARY OF THE INVENTION

A system and method is described herein that allows an audio device to increase the volume of an audio signal being played back to a user in a manner that preserves the perceived quality and intelligibility of the audio signal even when the dynamic range of the audio signal exceeds limits associated with one or more processing stages within the audio device.

In particular, a method is described herein for limiting distortion of an audio signal being processed for playback by an audio device. In accordance with the method, the audio signal is compressed to generate a compressed audio signal having a level that does not exceed a compression limit. The compressed audio signal is then soft clipped signal to generate a soft-clipped audio signal having a level that does not exceed a soft clipping limit, wherein the compression limit exceeds the soft clipping limit.

The foregoing method may further include passing the audio signal through a shaping filter prior to compressing the audio signal, wherein passing the audio signal through a shaping filter comprises modifying the level of selected frequency components of the audio signal.

A system for limiting distortion of an audio signal being processed for playback by an audio device is also described herein. The system includes a compressor and a soft clipper. The compressor is configured to compress the audio signal to generate a compressed audio signal having a level that does not exceed a compression limit. The soft clipper is configured to soft clip the compressed audio signal to generate a soft-clipped audio signal having a level that does not exceed a soft clipping limit, wherein the compression limit exceeds the soft clipping limit.

The foregoing system may further include a shaping filter configured to modify the level of selected frequency components of the audio signal prior to compression of the audio signal by the compressor.

An additional method for limiting distortion of an audio signal being processed for playback by an audio device is also described herein. In accordance with the method, the audio signal is passed through a shaping filter that modifies the level of selected frequency components of the audio signal, thereby producing a shaped audio signal. The shaped audio signal is then compressed to generate a compressed audio signal having a level that does not exceed a compression limit.

An additional system for limiting distortion of an audio signal being processed for playback by an audio device is also described herein. The system includes a shaping filter and a compressor. The shaping filter is configured to modify the level of selected frequency components of the audio signal, thereby producing a shaped audio signal. The compressor is configured to compress the shaped audio signal to generate a compressed audio signal having a level that does not exceed a compression limit.

A further method for limiting distortion of an audio signal being processed for playback by an audio device is described herein. In accordance with the method, the audio signal is passed through a shaping filter that modifies the level of selected frequency components of the audio signal, thereby producing a shaped audio signal. The shaped audio signal is then limited to generate a limited audio signal. Limiting the shaped audio signal may comprise, for example, soft clipping or hard clipping the shaped audio signal.

A further system for limiting distortion of an audio signal being processed for playback by an audio device is described herein. The system includes a shaping filter and a limiter. The shaping filter is configured to modify the level of selected frequency components of the audio signal, thereby producing a shaped audio signal. The limiter is configured to limit the shaped audio signal to generate a limited audio signal.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
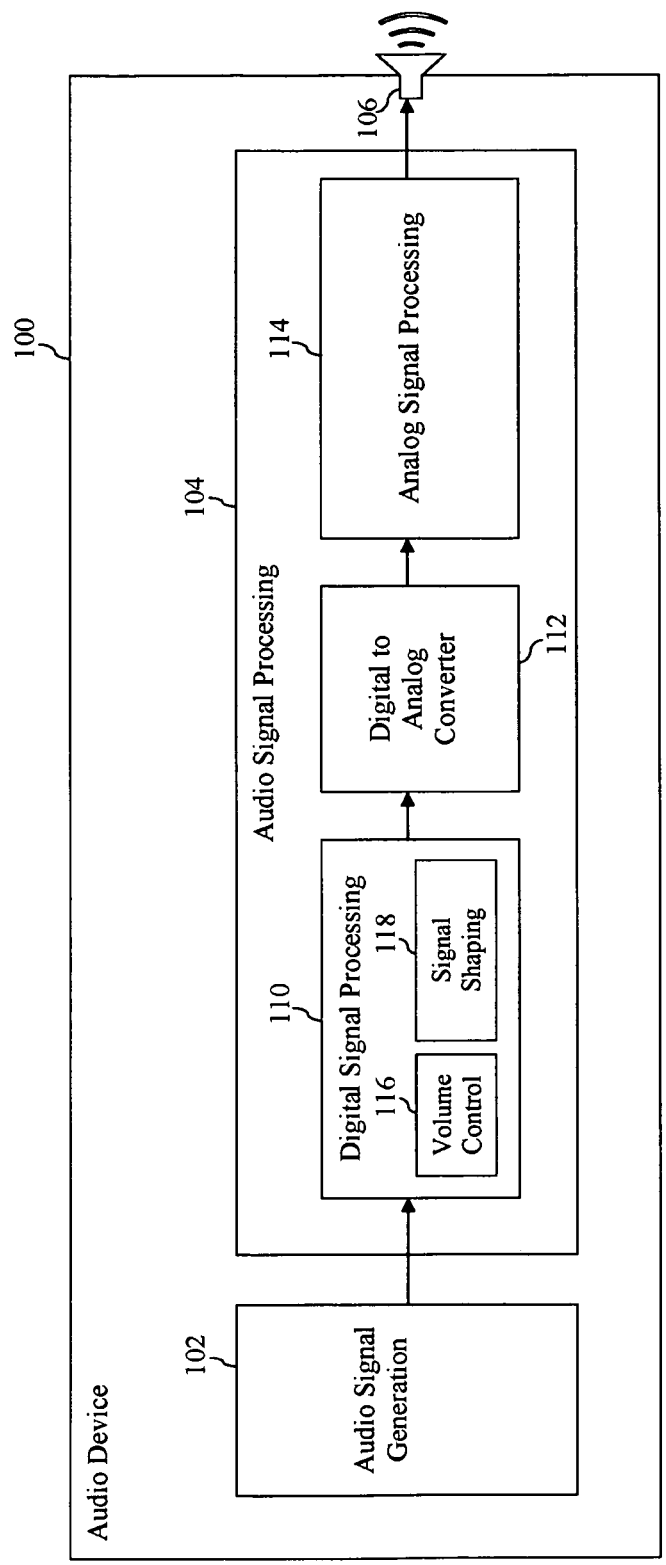
FIG. 1 is a block diagram of an example audio device in which an embodiment of the present invention may be implemented.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

A. Example Operating Environment

FIG. 1 is a block diagram of an example audio device 100 in which an embodiment of the present invention may be implemented. Audio device 100 may represent any one of a wide variety of devices that are capable of processing an audio signal for playback to a user. For example, audio device 100 may comprise a telephony-related device such as a cellular telephone, cordless handset, wired or wireless headset, or a hands-free speakerphone. Audio device 100 may also comprise a portable device that is configured to play audio content such as a personal media player, handheld computing device, or laptop computer. However, these examples are not intended to be limiting, any audio device 100 may represent other types of devices that are configured to process an audio signal for playback to a user other than those listed above.

As shown in FIG. 1, audio device 100 includes a number of interconnected elements including audio signal generation logic 102, audio signal processing logic 104, and a speaker 106. Audio signal generation logic 102 is configured to generate a digital representation of an audio signal for subsequent play back to a user. Depending upon the application, audio signal generation logic 102 may produce the digital representation of the audio signal locally (e.g., by accessing a digital audio file stored in a memory that is internal to audio device 100) and/or receive the digital representation of the audio signal from a remote entity or device, such as a telephone or remote computer, via a wired or wireless connection. In either case, audio signal generation logic 102 may include logic for decrypting and/or decompressing the digital representation of the audio signal.

Audio signal processing logic 104 is configured to process the digital representation of the audio signal received from audio signal generation logic 102 to produce an analog representation of the audio signal suitable for playback to a user via speaker 106. To perform this function, audio signal processing logic 104 includes a number of interconnected components including digital signal processing logic 110, a digital-to-analog converter 112 and analog signal processing logic 114. Digital signal processing logic 110 is configured to perform operations on the digital representation of the audio signal received from audio signal generation logic 102 to place it in condition for playback. Digital-to-analog converter 112 is configured to receive the processed digital representation of the audio signal from digital signal processing logic 110 and to convert it into an analog representation of the audio signal. Analog signal processing logic 114 is configured to receive the analog representation of the audio signal from digital-to-analog converter 112, to perform operations on the analog representation of the audio signal to further place it in condition for playback, and to provide the processed analog representation of the audio signal to speaker 106. Speaker 106 comprises an electro-mechanical transducer that operates in a well-known manner to convert the processed analog representation of the audio signal into sound waves for perception by a user.

As further shown in FIG. 1, digital signal processing logic 110 includes volume control logic 116 and signal shaping logic 118. Volume control logic 116 is configured to perform operations to increase or decrease the volume associated with the digital representation of the audio signal being processed by digital signal processing logic 110. Volume control logic 116 may perform this function responsive to input provided by a user of audio device 100 via a user interface (not shown in FIG. 1). Alternatively, volume control logic 116 may be configured to operate independently of user input and increase or decrease the volume associated with the digital representation of the audio signal based on the content of the audio signal itself and/or other factors or parameters.

Signal shaping logic 118 is configured to receive the digital representation of the audio signal after volume control has been applied by volume control logic 116. Signal shaping logic 118 is configured to shape the digital representation of the audio signal in a manner that will preserve the perceived quality and intelligibility of the audio signal even when a volume increase applied by volume control logic 116 causes the dynamic range of the audio signal to exceed limits associated with one or more subsequent digital or analog processing elements within audio signal processing logic 104. The manner in which signal shaping logic 118 operates to perform this function will be described in detail below.

Although signal shaping logic 118 is shown as part of digital signal processing logic 110 and is described as operating on a digital representation of an audio signal, based on the teachings provided herein, persons skilled in the relevant art(s) will readily appreciate that the elements of signal shaping logic 118 may also be implemented as part of analog signal processing logic 114 and operate on an analog representation of the audio signal. Furthermore, audio device 100 has been presented herein by way of example only. The present invention may be implemented in audio devices other than those configured in the manner described above with respect to audio device 100.

Figure 2:
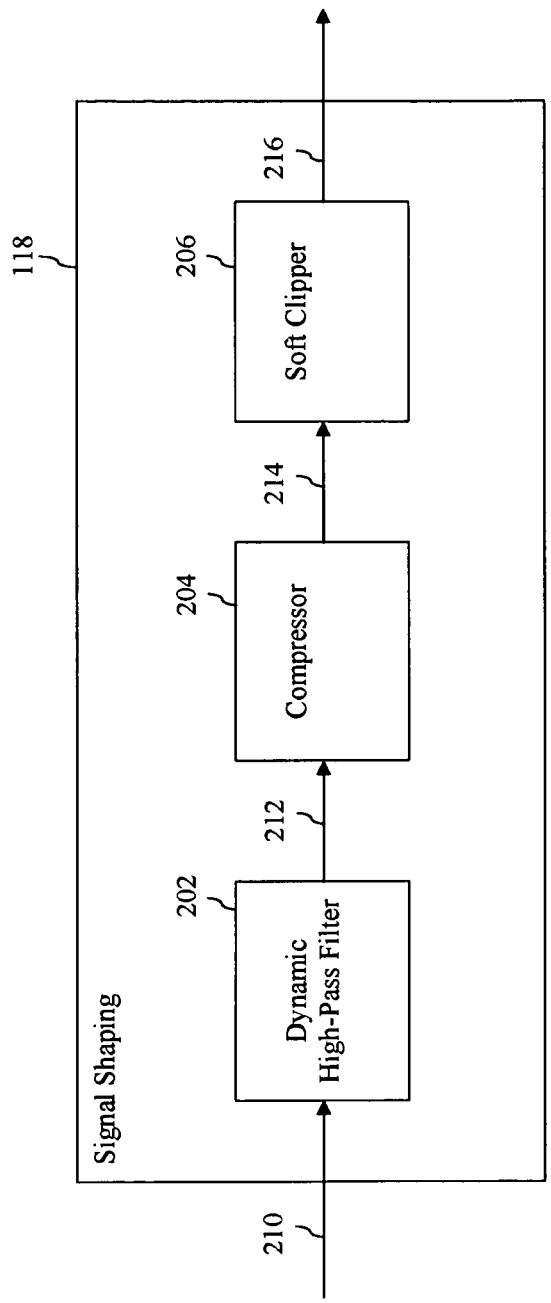
FIG. 2 is a block diagram of signal shaping logic in accordance with an embodiment of the present invention.

B. Signal Shaping Logic in Accordance with an Embodiment of the Present Invention FIG. 2 is a block diagram of signal shaping logic 118 in accordance with one embodiment of the present invention. As shown in FIG. 2, signal shaping logic 118 includes three processing stages: a dynamic high-pass filter 202, a compressor 204, and a soft clipper 206. Collectively, these stages operate to shape an audio signal such that when the audio signal is played back via speaker 106, both increased loudness and intelligibility may be obtained. Each of these stages will be described in detail below.

Because signal shaping logic 118 is part of digital signal processing logic 110, it is to be understood that each stage of signal shaping logic 118 described below is configured to operate on a digital representation of an audio signal. However, for the sake of brevity, the following sections will simply refer an "audio signal" rather than a "digital representation of an audio signal." Persons skilled in the relevant art(s) should understand that these terms may be used interchangeably.

1. Dynamic High-Pass Filter

Dynamic high pass filter 202 is configured to receive an input audio signal 210 from another digital signal processing element within digital signal processing logic 110 and to filter input audio signal 210 to produce a filtered audio signal 212. Dynamic high-pass filter 202 is configured to filter input audio signal 210 in a manner that reduces the level of selected frequency components within input audio signal 210. The amount of attenuation applied to the selected frequency components is based on the level of input audio signal 210. The reduction of the level of the selected frequency components by dynamic high-pass filter 202 has the beneficial effect of reducing the amount of compression that must subsequently be applied to filtered audio signal 212 by compressor 204 in order to achieve a desired mix of increased loudness and intelligibility.

In one embodiment, the selected frequency components are lower frequency components within the audio signal. Where the audio signal is a speech signal, the level of certain lower frequency components may be reduced without significantly impacting the intelligibility of the speech signal, since most of the information that is important for intelligibility is carried in higher frequencies. For example, in one embodiment, dynamic high pass filter 202 applies at least some level of attenuation to all frequencies below approximately 1500 Hertz (Hz), while passing all other frequencies.

Reducing the level of the lower frequencies within input audio signal 210 may also be deemed tolerable or even desirable in embodiments of audio device 100 in which speaker 106 is inefficient at the lower frequencies or in which the speaker 106 and/or a mounting in which speaker 106 resides introduces distortion (e.g., due to rattling) at the lower frequencies.

Figure 3:
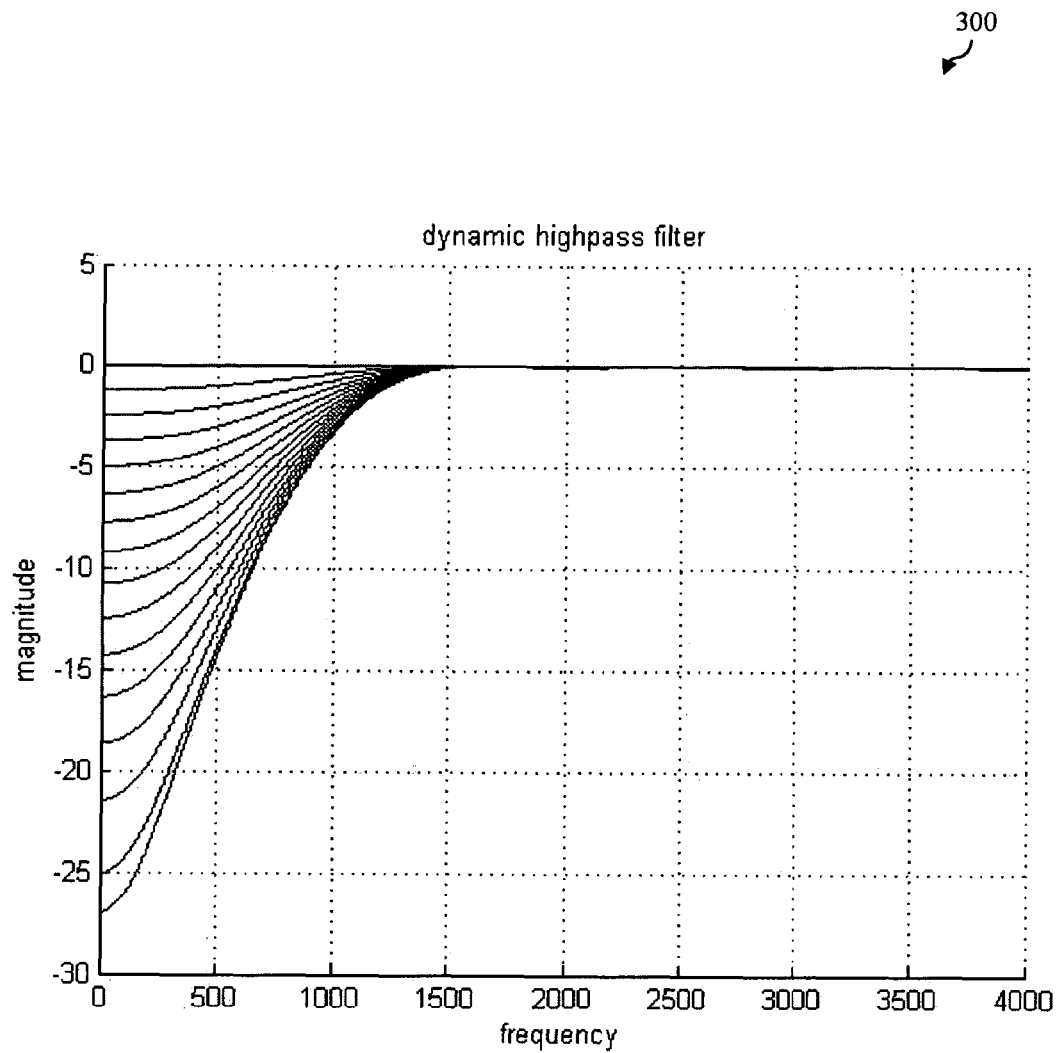
FIG. 3 depicts a graph of a frequency response of a dynamic high pass filter in accordance with one embodiment of the present invention.

FIG. 3 depicts a graph 300 of the frequency response of dynamic high pass filter 202 in accordance with one embodiment of the present invention. In graph 300, the horizontal axis represents the frequency of input audio signal 210 in hertz (Hz) while the vertical axis shows the magnitude of the gain applied by filter 202 in decibels (dB). As shown by graph 300, the frequency response of dynamic high-pass filter 202 changes in a manner that depends on the level of audio input signal 210, with a 1 dB step size between the different frequency responses occurring at 500 Hz. As also shown by graph 300, dynamic high pass filter 202 applies at least some level of attenuation to all frequencies below approximately 1500 Hertz (Hz), while passing all other frequencies.

Figure 4:
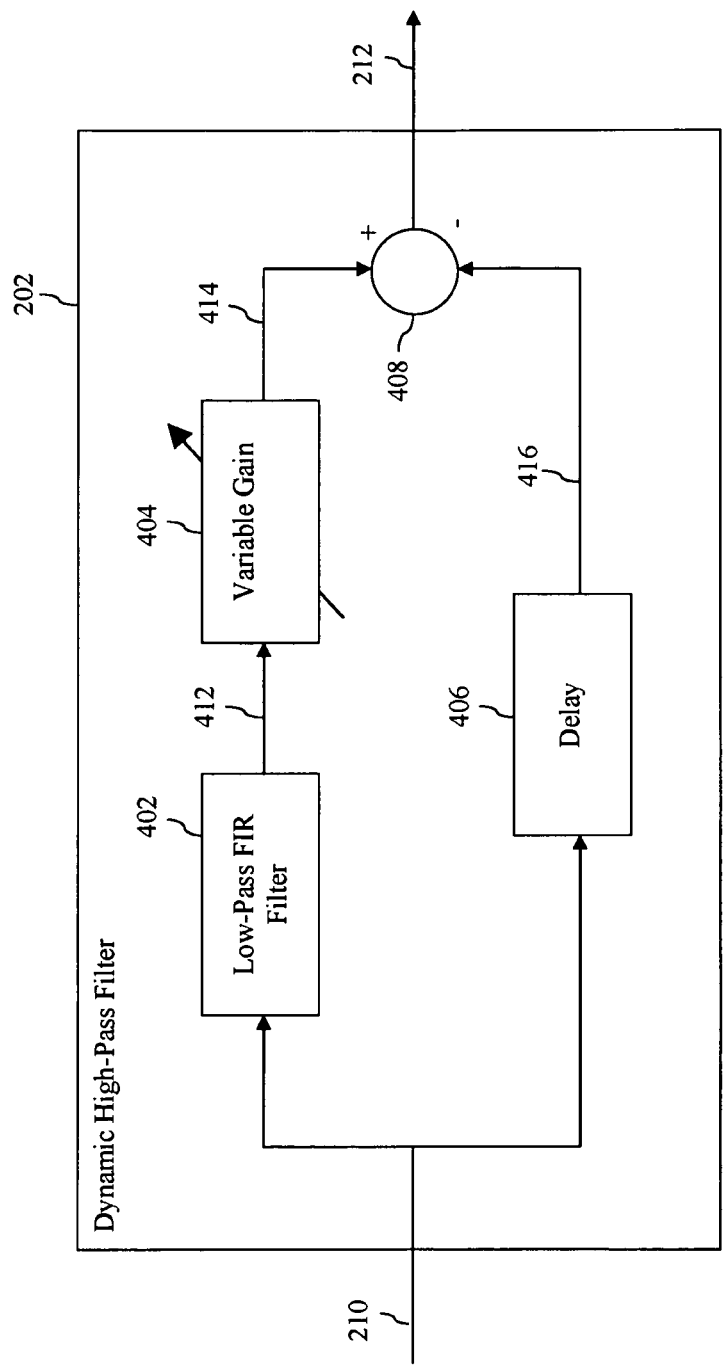
FIG. 4 is a block diagram of a dynamic high-pass filter in accordance with an embodiment of the present invention.

FIG. 4 is a block diagram of one example implementation of dynamic high-pass filter 202. In accordance with this implementation, input audio signal 210 is passed through a low-pass finite impulse response (FIR) filter 402 to produce a low-pass audio signal 412. Variable gain logic 404 then scales low-pass audio signal 412 to generate a scaled low-pass audio signal 414. Input audio signal 210 is also passed through a delay 406, which functions to delay input audio signal 210 by an amount of time equal to the group delay of low-pass FIR filter 402, to generate a delayed audio signal 416. A combiner 408 subtracts scaled low-pass audio signal 414 from delayed audio signal 416, thereby attenuating the lower frequencies in delayed audio signal 416 to produce filtered audio signal 212.

The amount of attenuation applied to delayed audio signal 416 is controlled by the amount of scaling applied to low-pass audio signal 412 by variable gain logic 404. In one embodiment, variable gain logic 404 multiplies low-pass audio signal by a scaling factor α which varies from 0 to 1 depending on the level of input audio signal 210. The sensitivity of variable gain logic 404 to the level of input audio signal 210 is determined by the relationship between scaling factor α and the level of input audio signal 210. This relationship may be, for example, linear, quadratic, piece-wise linear, logarithmic, or the like.

The implementation of dynamic high-pass filter 202 shown in FIG. 4 and described above is provided by way of example only. Persons skilled in the relevant art(s) will appreciate that a variety of other designs or components may be used to implement dynamic high-pass filter 202.

2. Compressor

Compressor 204 is configured to receive filtered audio signal 212 from dynamic high-pass filter 202 and to apply compression to filtered audio signal 212 to produce a compressed audio signal 214. Compressor 204 operates by manipulating the dynamic range of filtered audio signal 212 such that the level of the signal does not exceed a compression limit. As will be discussed in more detail herein, this compression limit may exceed a soft clipping limit utilized by soft clipper 206 such that, at higher volumes, the dynamic range of compressed audio signal 214 output by compressor 204 will exceed the soft clipping limit of soft clipper 206. This overdriving of soft clipper 206 will lead to some level of clipping distortion. However, through careful selection of the compression limit and the soft clipping limit, the amount of clipping distortion can advantageously be held to an acceptable level while maintaining loudness.

Figure 5:
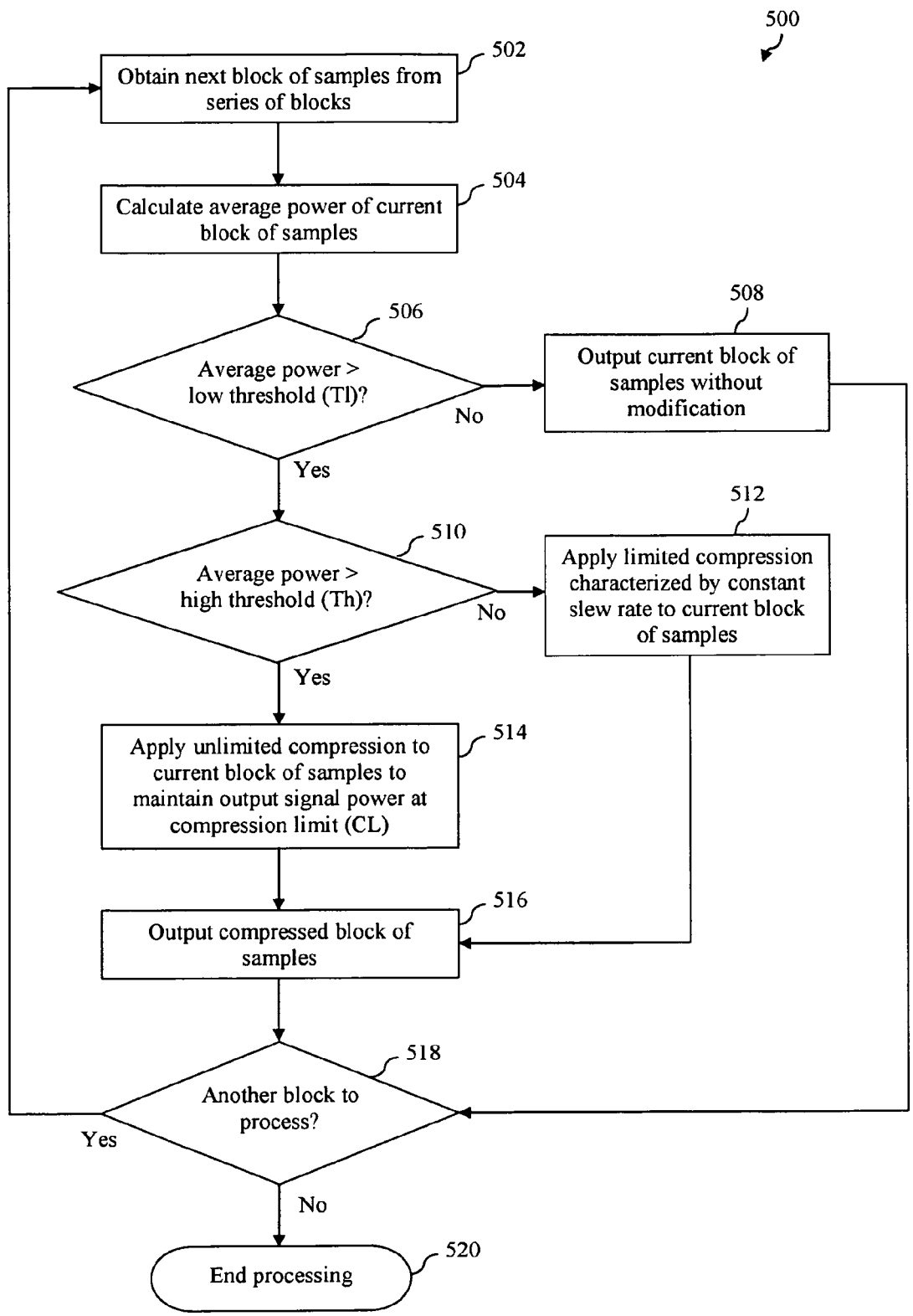
FIG. 5 depicts a flowchart of a compression algorithm in accordance with an embodiment of the present invention.

FIG. 5 depicts a flowchart 500 of one compression algorithm that may be used to implement compressor 204. This algorithm is presented by way of example only and is not intended to limit the present invention. The compression algorithm of flowchart 500 operates on filtered audio signal 212 by dividing the signal into blocks of samples and processing the blocks in series. The number of samples per block may vary depending upon the implementation. Each block of samples represents a segment of the filtered audio signal 212.

As shown in FIG. 5, the method of flowchart 500 begins at step 502, in which compressor 204 obtains a next block of samples in the series of blocks comprising filtered audio signal 212. For the remainder of the description of this flowchart, the block of samples obtained in step 502 will be referred to as the current block of samples.

At step 504, compressor 204 calculates an average power of the current block of samples. In one embodiment, the average power of the current block of samples is calculated by computing a sum of squares of the samples in the current block to obtain a total power for the block, converting the result to dB, and then normalizing to the block size. However, other methods of calculating the average power of the current block of samples may be used.

At decision step 506, compressor 204 determines if the average power of the current block of samples, as calculated during step 504, exceeds a low threshold, which may be denoted T1. If the average power of the current block of samples does not exceed the low threshold, then no compression is applied to the current block of samples and the current block is output by compressor 204 without modification as shown at step 508.

However, if compressor 204 determines at decision step 506 that the average power of the current block of samples exceeds the low threshold, then control flows to decision step 510.

At decision step 510, compressor 204 determines if the average power of the current block of samples exceeds a high threshold, which may be denoted Th. If the average power of the current block of samples does not exceed the high threshold, then a limited amount of compression is applied to the current block of samples, wherein the limited amount of compression is characterized by a constant slew rate with a slope of x dB/dB between the low threshold and the high threshold, as shown at step 512. After this, the compressed block of samples is output by compressor 204 as shown at step 516.

However, if compressor 204 determines at decision step 510 that the average power of the current block of samples exceeds the high threshold, then unlimited compression is applied to the current block of samples to keep the power of the output signal at a compression limit, which may be denoted CL, as shown at step 514. After this, the compressed block of samples is output by compressor 204 as shown at step 516.

After compressor 204 outputs an unmodified block of samples at step 508 or outputs a compressed block of samples at step 516, control flows to decision step 518. At decision step 518, compressor 204 determines whether or not there is another block in the series of blocks that need to be processed. If there is, then control returns to step 502. Otherwise, processing ends as shown at step 520.

As can be seen from the foregoing algorithm, the amount of compression applied to an input signal by compressor 204 varies with the power level of the input signal. Thus, the amount of compression applied can vary over time.

Figure 6:
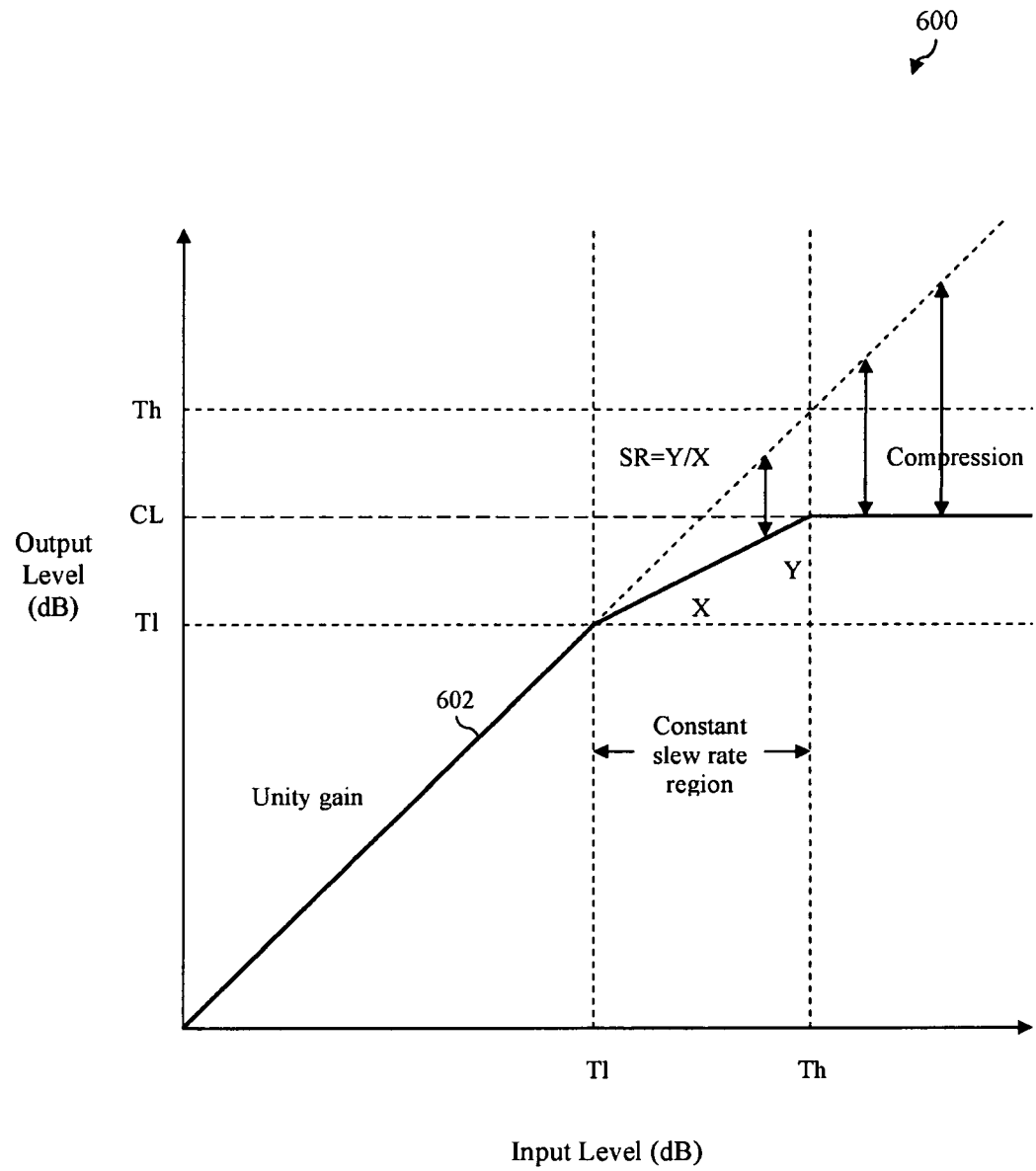
FIG. 6 depicts a graph of a transfer function of a compressor in accordance with one embodiment of the present invention.

FIG. 6 depicts a graph 600 of a transfer function of compressor 204 in accordance with one embodiment of the present invention. In graph 600, the level of the input to compressor 204 is represented on the horizontal axis in dB, the level of the output of compressor 204 is represented on the vertical axis in dB, and a solid line 602 represents the relationship between the level of the compressor input and output.

As shown in graph 600, for an input signal having a level that does not exceed a low threshold (denoted T1), unity gain is applied such that the output signal level is equal to the input signal level. For an input signal having a level that exceeds low threshold T1 but that does not exceed a high threshold (denoted Th), limited compression is applied to the signal, wherein the limited compression is characterized by a constant slew rate (denoted SR in graph 600), with a slope=Y/X. In graph 600, Y represents the difference between low threshold T1 and a compression limit (denoted CL) associated with compressor 204, while X represents the difference between low threshold T1 and high threshold Th. For an input signal having a level that exceeds high threshold Th, unlimited compression is applied to keep the level of the output signal at a constant compression limit CL.

It is noted that by adjusting the slew rate (SR) slope Y/X, the shape of the compression curve may be varied. In certain embodiments, the slew-rate limited region has a slope in the range of [0, 1], although the invention is not so limited.

3. Soft Clipper

Soft clipper 206 is configured to receive compressed audio signal 214 from compressor 204 and to apply soft clipping to compressed audio signal 214 to produce a soft-clipped audio signal 216. Soft clipper 206 operates by manipulating the dynamic range of compressed audio signal 214 such that the level of the signal does not exceed a soft clipping limit. As noted above, the soft clipping limit is less than or equal to the compression limit used by compressor 204.

Figure 7:
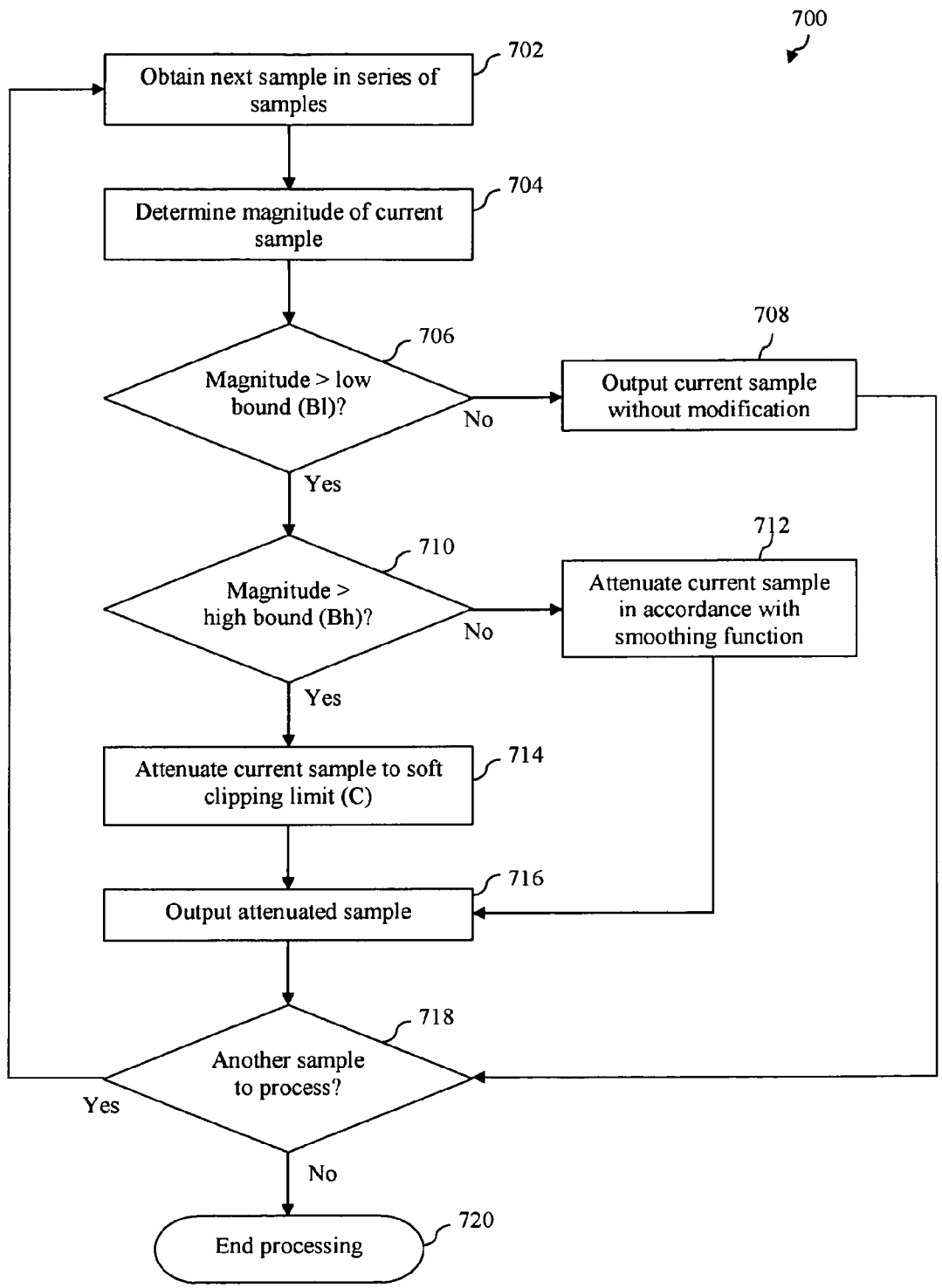
FIG. 7 depicts a flowchart of a soft clipping algorithm in accordance with an embodiment of the present invention.

FIG. 7 depicts a flowchart 700 of one soft clipping algorithm that may be used to implement soft clipper 206. This algorithm is presented by way of example only and is not intended to limit the present invention. The soft clipping algorithm of flowchart 700 operates on compressed audio signal 214 on a sample-by-sample basis.

As shown in FIG. 7, the method of flowchart 700 begins at step 702, in which soft clipper 206 obtains a next sample in the series of samples comprising compressed audio signal 214. For the remainder of the description of this flowchart, the sample obtained in step 702 will be referred to as the current sample.

At step 704, soft clipper 204 determines the magnitude of the current sample.

At decision step 706, soft clipper 206 determines if the magnitude of the current sample exceeds a low bound, which may be denoted B1. If the magnitude of the current sample does not exceed the low bound, then no attenuation is applied and the current sample is output by soft clipper 206 without modification as shown at step 708.

However, if soft clipper 206 determines at decision step 706 that the magnitude of the current sample exceeds the low bound, then control flows to decision step 710.

At decision step 710, soft clipper 206 determines if the magnitude of the current samples exceeds a high bound, which may be denoted Bh. If the magnitude of the current sample does not exceed the high bound, then the current sample is attenuated in accordance with a smoothing function, which in one embodiment comprises a quadratic type functions. The smoothing function will be discussed in more detail below. After this, the attenuated sample is output by soft clipper 206 as shown at step 716.

However, if soft clipper 206 determines at decision step 710 that the magnitude of the current sample exceeds the high bound, then the current sample is attenuated to a soft clipping point, which may be denoted C, as shown at step 714. After this, the attenuated sample is output by soft clipper 206 as shown at step 716.

After soft clipper 206 outputs an unmodified sample at step 708 or outputs an attenuated sample at step 716, control flows to decision step 718. At decision step 718, soft clipper 206 determines whether or not there is another sample in the series of samples that need to be processed. If there is, then control returns to step 702. Otherwise, processing ends as shown at step 720.

In one embodiment, the soft clipping limit C (which may also be referred to as the peak level limit) discussed above in reference to step 714 is a constant that does not vary with time. In accordance with such an embodiment, the response of soft clipper 206 will also not vary with time.

Figure 8:
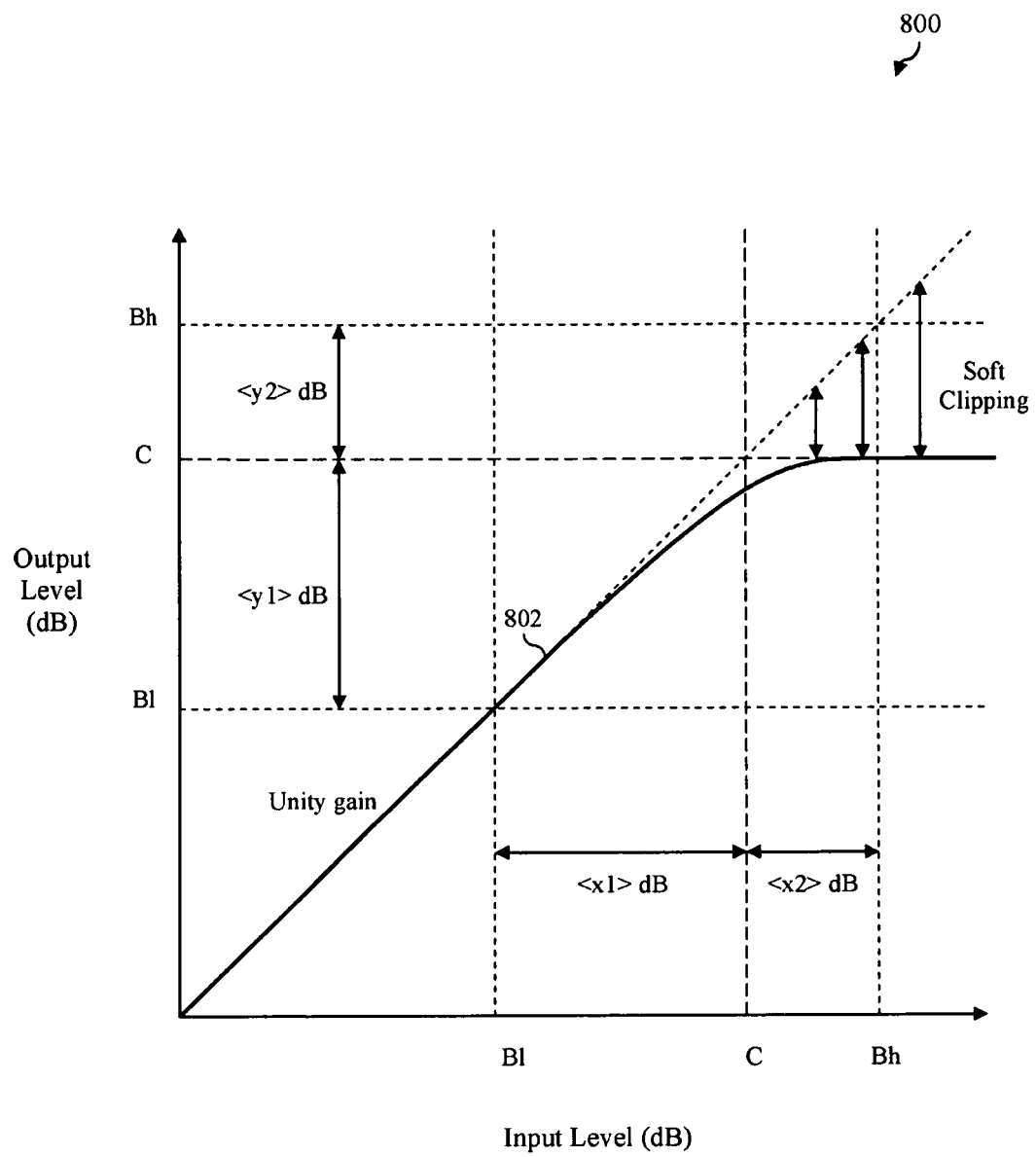
FIG. 8 depicts a graph of a transfer function of a soft clipper in accordance with one embodiment of the present invention.

FIG. 8 depicts a graph 800 of a transfer function of soft clipper 206 in accordance with one embodiment of the present invention. In graph 800, the level of the input to soft clipper 206 is represented on the horizontal axis in dB, the level of the output of soft clipper 206 is represented on the vertical axis in dB, and a solid line 802 represents the relationship between the level of the soft clipper input and output.

As shown in graph 800, the transfer function of soft clipper 206 is a monotonically increasing function. For an input signal having a level that does not exceed a low bound (denoted B1), unity gain is applied such that the output signal level is equal to the input signal level. For an input signal having a level that exceeds a high bound (denoted Bh), attenuation is applied to keep the level of the output signal at a constant soft clipping limit (denoted C). For an input signal having a level that exceeds low bound B1 but that does not exceed high bound Bh, the signal is attenuated in accordance with a smoothing function. The smoothing function is used to ensure that the transfer function is piece-wise continuous in the transition region between the unity gain region and the region in which the output is limited to soft clipping limit C. This helps to reduce audible distortion. Depending upon the implementation, the smoothing function may also be used to ensure that the first derivative of the transfer function is continuous in the transition region, although this need not be the case. In one embodiment, the smoothing function is implemented using a quadratic function.

With further reference to graph 800, as the level of the input signal to soft clipper 206 increases beyond the soft clipping limit C, it is expected that soft clipper 206 will produce an output signal that appears increasingly like a hard-clipped signal.

Figure 9:
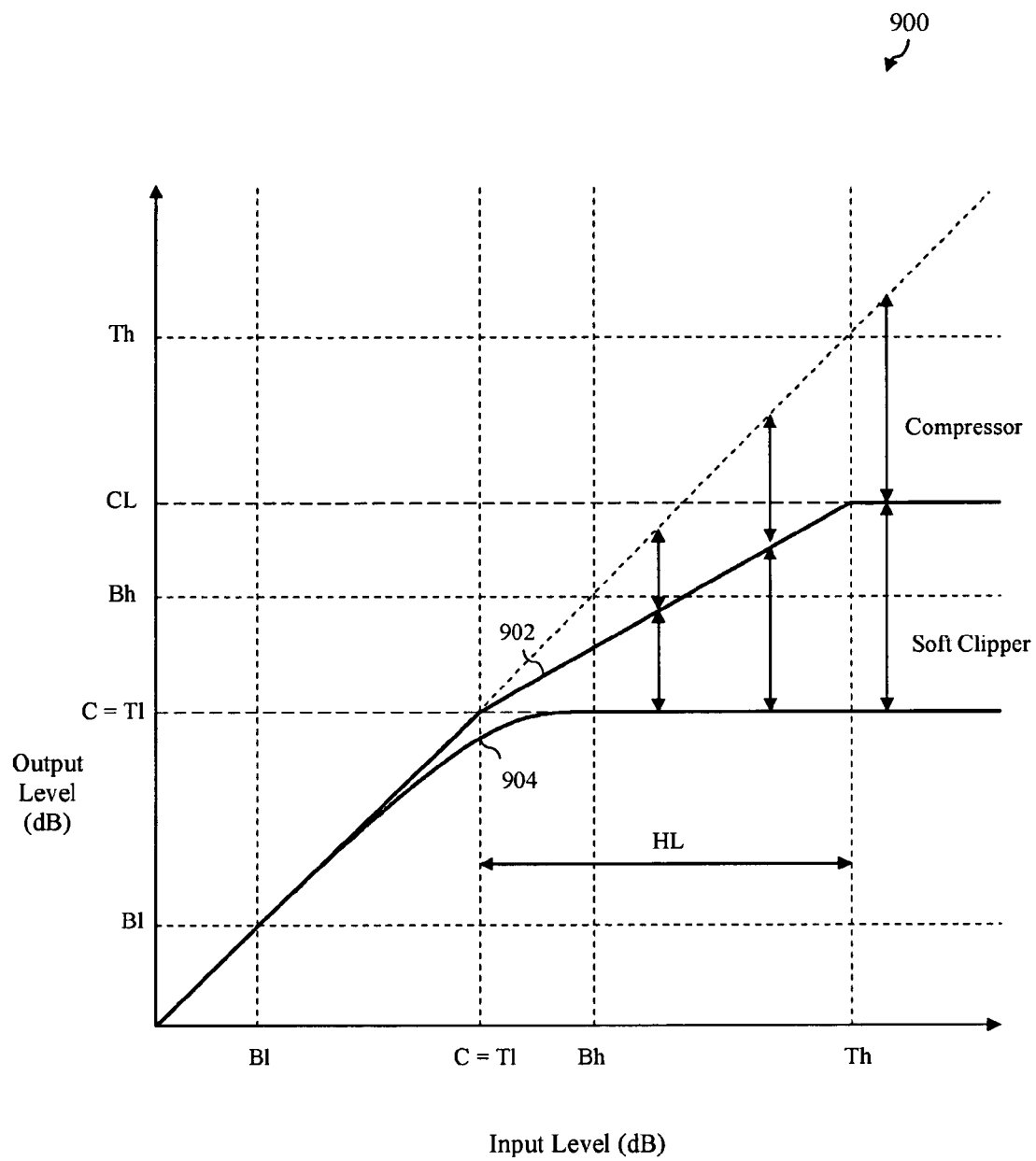
FIG. 9 depicts a graph that shows the transfer functions of a compressor and a soft clipper in accordance with an embodiment of the present invention.

FIG. 9 depicts a graph 900 that shows in an overlaid fashion the transfer functions of compressor 204 and soft clipper 206 in accordance with one implementation of the present invention. In graph 900, the level of the input to each of the elements is represented on the horizontal axis in dB and the level of the output of each of these elements is represented on the vertical axis in dB. A solid line 902 represents the relationship between the level of the compressor input and output while a solid line 904 represents the relationship between the level of the soft clipper input and output. In graph 900, T1, Th and CL respectively represent the low threshold, high threshold and compression limit used by compressor 204 as discussed above in reference to flowchart 500 of FIG. 5 and graph 600 of FIG. 6, while B1, Bh and C respectively represent the low bound, high bound and soft clipping limit used by soft clipper 206 as discussed above in reference to flowchart 700 of FIG. 7 and graph 800 of FIG. 8.

As shown in graph 900, the compression limit CL of compressor 204 exceeds the soft clipping limit C of soft clipper 206. In the particular implementation represented by graph 900, the lower threshold T1 of compressor 204 and the soft clipping limit C of soft clipper 206 are equal. By using a compression limit CL that exceeds the soft clipping limit C, an embodiment of the present invention can advantageously control the extent to which pseudo-hard clipping is performed by soft clipper 206 due to the processing of input signals with levels that exceed the soft clipping limit C. This means that the amount of distortion introduced by soft clipper 206 due to increasing the volume of an audio signal can be controlled. As shown by graph 900, the maximum levels of pseudo-hard clipping will occur when soft clipper 206 processes signals produced by compressor at the maximum compression level CL. In graph 900, HL denotes the delay in the onset of these maximum levels of pseudo-hard clipping from the soft limiting of signal larger than the soft clipping point C.

Depending upon the implementation, the lower threshold T1, the higher threshold Th and the compression limit CL associated with compressor 204 may be kept constant or may be selected or updated on a periodic basis (e.g., updated every one or more blocks of input samples) or based on some event. For example, in one implementation, these parameters are selected based on a mode or type of audio signal that is currently being processed by signal shaping logic 118. Likewise, the lower bound B1, the higher bound Bh and the soft clipping limit C associated with soft clipper 206 may be kept constant or may be selected or updated on a periodic basis or based on some event. In one implementation, the soft clipping limit C is set to equal the lower threshold T1 currently associated with compressor 204 and the lower bound B1 and higher bound Bh are set at a fixed amount above and below C, respectively. However, these examples are not intended to be limiting and other methods may be used to set these parameters.

Figure 10:
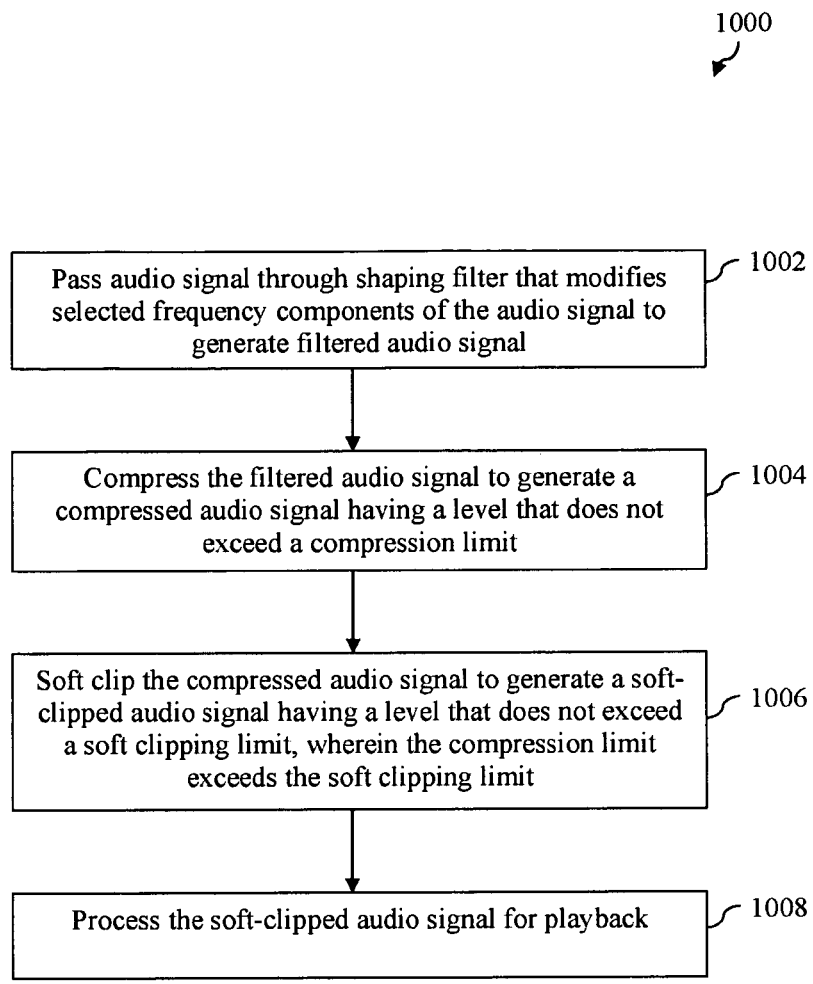
FIG. 10 depicts a flowchart of a method for limiting distortion of an audio signal being processed for playback by an audio device in accordance with an embodiment of the present invention.

C. Signal Shaping Method in Accordance with an Embodiment of the Present Invention FIG. 10 depicts a flowchart 1000 of a method for shaping an audio signal being processed for playback by an audio device to limit distortion thereof in accordance with an embodiment of the present invention. The method of flowchart 1000 may be implemented by signal shaping logic 118 as described above, although the method is not limited to that embodiment.

As shown in FIG. 10, the method of flowchart 1000 begins at step 1002, in which an audio signal is passed through a shaping filter that modifies selected frequency components of the audio signal to generate filtered audio signal. As discussed above, the shaping filter may comprise a dynamic high pass filter, such as dynamic high pass filter 202, which attenuates selected lower frequency components of the audio signal, wherein the amount of attenuation applied to the selected lower frequency components corresponds to the level of the audio signal.

At step 1004, the filtered audio signal is compressed to generate a compressed audio signal having a level that does not exceed a compression limit. One manner in which such compression may be applied was described above in reference to flowchart 500 of FIG. 5, although other compression techniques may be used to implement this step.

At step 1006, the compressed audio signal is soft clipped to generate a soft-clipped audio signal having a level that does not exceed a soft clipping limit, wherein the compression limit exceeds the soft clipping limit. One manner in which such soft clipping may be applied was described above in reference to flowchart 700 of FIG. 7, although other soft clipping techniques may be used to implement this step. As discussed above, the use of a compression limit that exceeds the soft clipping limit means that, at higher volumes, the dynamic range of the compressed audio signal will exceed the soft clipping limit, resulting in some level of clipping distortion. However, through careful selection of both the compression limit and the soft clipping limit, the amount of clipping distortion can advantageously be held to an acceptable level while maintaining loudness.

At step 1008, the soft-clipped audio signal is processed for playback by subsequent processing logic within the audio device.

With respect to step 1002 of flowchart 1000, it is noted that the method is not limited to the use of dynamic high pass filters. For example, step 1002 may be performed by a normal (i.e., non-dynamic) high pass filter or by some other type of shaping filter that is configured to modify selected frequency components of the audio signal. For example, step 1002 may be performed by a shaping filter that attenuates both lower and higher frequency bands of the audio signal. Step 1002 may also be performed by a band-stop filter, such as a notch filter, that attenuates frequencies only in a specific range. Furthermore, the shaping filter may also be configured to boost certain frequencies within the audio signal. For example, the shaping filter may be configured to boost all frequencies, but to boost lower frequencies to a lesser extent than higher frequencies. In a still further implementation, the dynamic high pass function is performed by dynamically compressing lower frequency bands within the audio signal.

Figure 11:
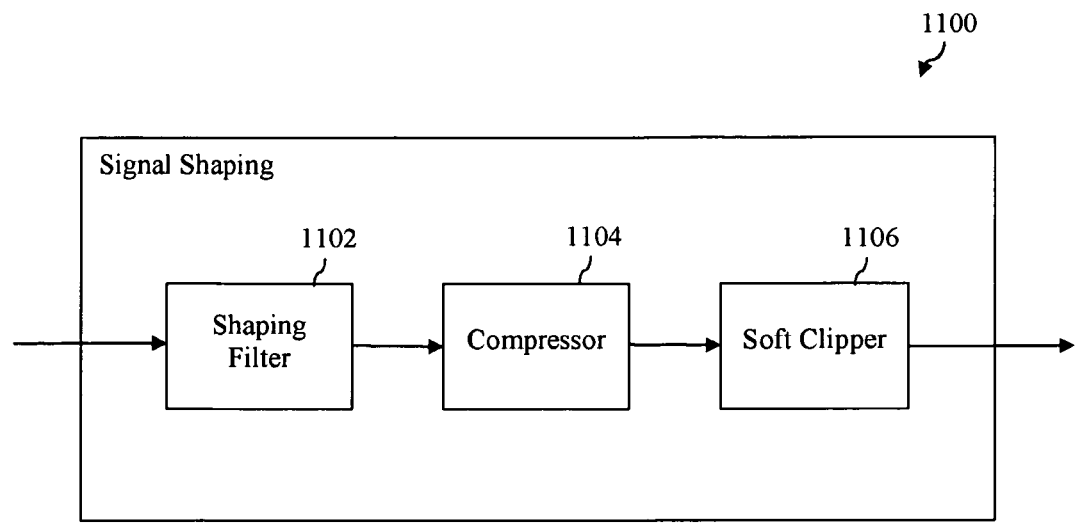
FIG. 11 is a block diagram of signal shaping logic in accordance with an alternate embodiment of the present invention that includes a shaping filter, a compressor and a soft-clipper.

The fact that various different types of shaping filters may be used to implement step 1002 of flowchart 1000 is reflected by FIG. 11, which depicts a block diagram of signal shaping logic 1100 in accordance with an embodiment of the present invention. As shown in FIG. 11, signal shaping logic 1100 includes a shaping filter 1102, a compressor 1104 and a soft-clipper 1106 in series. Shaping filter 1102 may comprise any type of filter that is configured to modify selected frequency components of an audio signal.

Figure 12:
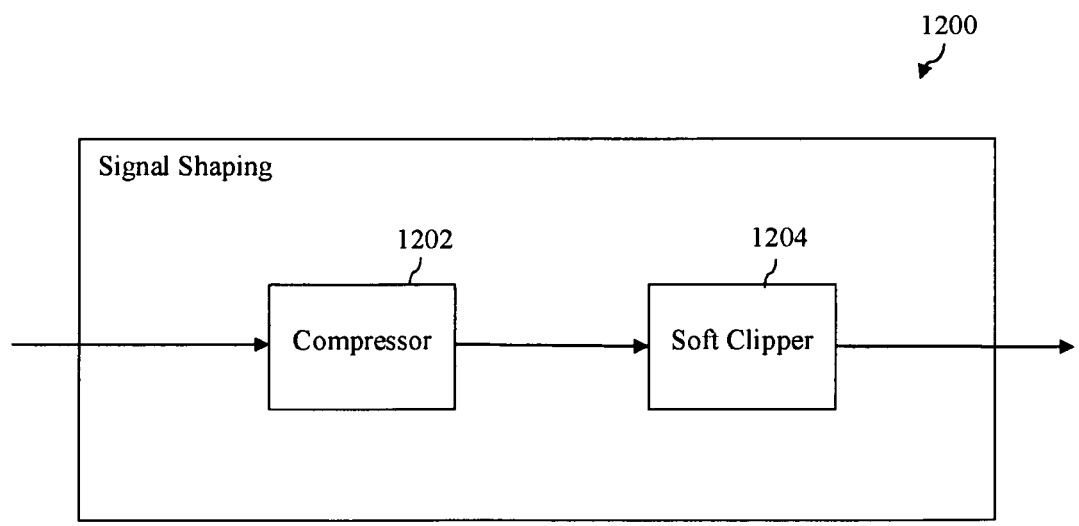
FIG. 12 is a block diagram of signal shaping logic in accordance with an alternate embodiment of the present invention that includes a compressor and soft-clipper.

C. Alternative Implementations of Signal Shaping Logic in Accordance with Embodiments of the Present Invention An alternate embodiment of the present invention may also not utilize any shaping filter whatsoever, but instead use just a compressor and soft clipper in series to control audio signal distortion due to a volume increase. Such an embodiment is depicted in FIG. 12, which is a block diagram of signal shaping logic 1200 that includes a compressor 1202 and a soft clipper 1204 in series. Although a shaping filter can be used to advantageously reduce the amount of compression that must be applied by the compressor as described elsewhere herein, the use of such a shaping filter is not necessary to obtain the benefits of the compressor and soft clipper combination as previously described.

Figure 13:
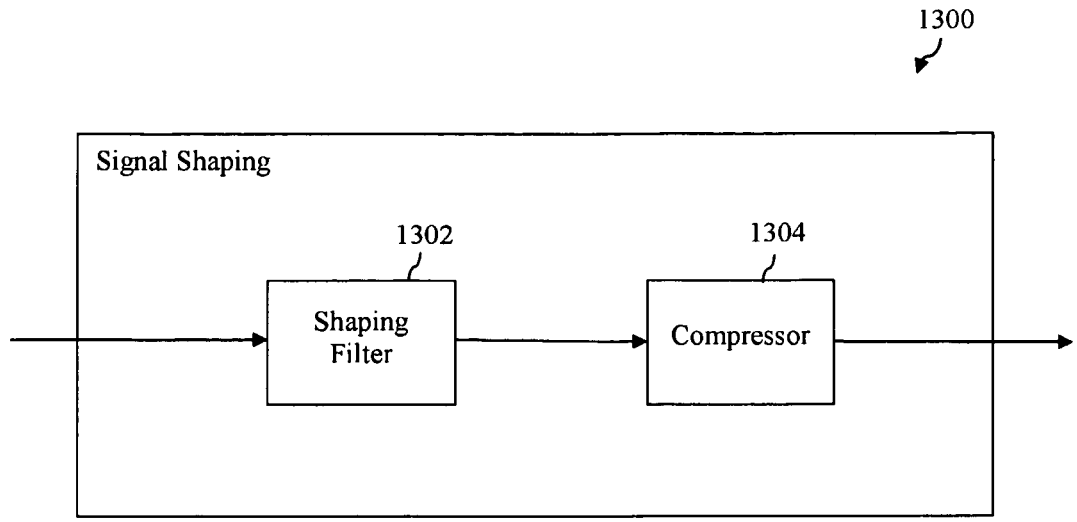
FIG. 13 is a block diagram of signal shaping logic in accordance with an alternate embodiment of the present invention that includes a shaping filter and a compressor.

A further alternate embodiment of the present invention may use a shaping filter and a compressor in series without a soft clipper. Such an embodiment is depicted in FIG. 13, which is a block diagram of signal shaping logic 1300 that includes a shaping filter 1302 and a compressor 1304 in series. Here, shaping filter 1302 is advantageously used to modify selected frequency components of an audio signal, thereby reducing the magnitude of the audio signal. The amount of compression that must be applied to the audio signal by compressor 1304 to avoid distortion is thus reduced, which allows for some increased loudness of the audio signal.

Figure 14:
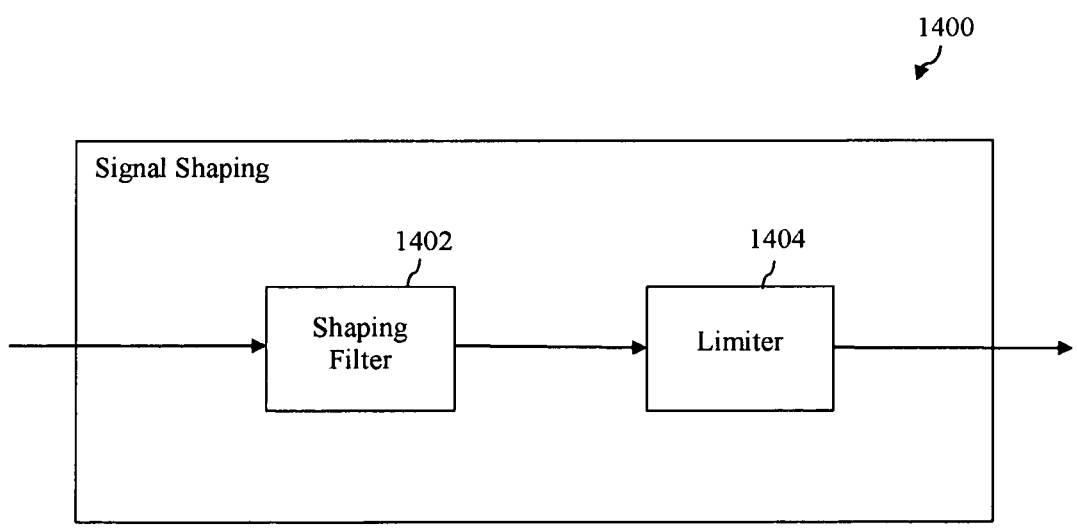
FIG. 14 is a block diagram of signal shaping logic in accordance with an alternate embodiment of the present invention that includes a shaping filter and a limiter.

A still further alternate embodiment of the present invention is depicted in the block diagram of FIG. 14, which shows signal shaping logic 1400 that includes a shaping filter 1402 and a limiter 1404 in series. Here again, shaping filter 1402 is advantageously used to modify selected frequency components of an audio signal, thereby reducing the magnitude of the audio signal. The amount of limiting applied to the signal by limiter 1404, which may comprise for example a hard clipper or a soft clipper, will therefore be reduced, which will result in less distortion of the audio signal.

D. Hardware and Software Implementations

The present invention can be implemented in hardware, in software, or as a combination of hardware and software. Aspects of the present invention that may be implemented in software may be executed on a computer system, such as computer system 1500 of FIG. 15. For example, each of the elements of signal shaping logic 118 as described above may be implemented in software and executed by computer system 1500.

Figure 15:
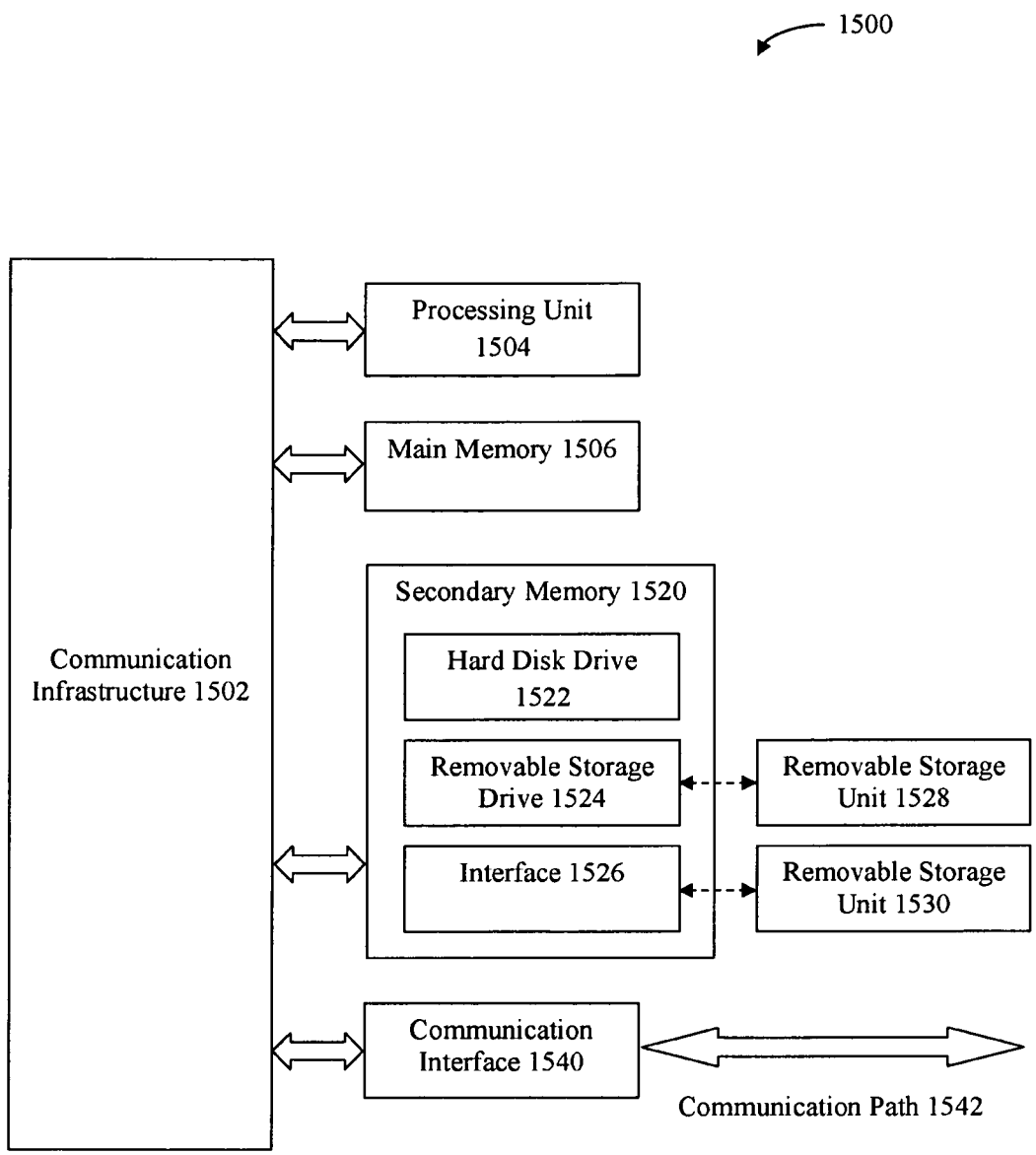
FIG. 15 is a block diagram of a processor-based system that may be used to implement the present invention.

As shown in FIG. 15, computer system 1500 includes a processing unit 1504 that includes one or more processors. Processor unit 1504 is connected to a communication infrastructure 1502, which may comprise, for example, a bus or a network.

Computer system 1500 also includes a main memory 1506, preferably random access memory (RAM), and may also include a secondary memory 1520. Secondary memory 1520 may include, for example, a hard disk drive 1522 and/or a removable storage drive 1524, representing a floppy disk drive, a magnetic tape drive, an optical disk drive, or the like. Removable storage drive 1524 reads from and/or writes to a removable storage unit 1528 in a well known manner. Removable storage unit 1528 represents a floppy disk, magnetic tape, optical disk, or the like, which is read by and written to by removable storage drive 1524. As will be appreciated by persons skilled in the relevant art(s), removable storage unit 1528 includes a computer usable storage medium having stored therein computer software and/or data.

In alternative implementations, secondary memory 1520 may include other similar means for allowing computer programs or other instructions to be loaded into computer system 1500. Such means may include, for example, a removable storage unit 1530 and an interface 1526. Examples of such means may include a program cartridge and cartridge interface (such as that found in video game devices), a removable memory chip (such as an EPROM, or PROM) and associated socket, and other removable storage units 1530 and interfaces 1526 which allow software and data to be transferred from removable storage unit 1530 to computer system 1500.

Computer system 1500 may also include a communications interface 1540. Communications interface 1540 allows software and data to be transferred between computer system 1500 and external devices. Examples of communications interface 1540 may include a modem, a network interface (such as an Ethernet card), a communications port, a PCM-CIA slot and card, etc. Software and data transferred via communications interface 1540 are in the form of signals which may be electronic, electromagnetic, optical, or other signals capable of being received by communications interface 1540. These signals are provided to communications interface 1540 via a communications path 1542. Communications path 1542 carries signals and may be implemented using wire or cable, fiber optics, a phone line, a cellular phone link, an RF link and other communications channels.

As used herein, the terms "computer program medium" and "computer readable medium" are used to generally refer to media such as removable storage unit 1528, removable storage unit 1530 or a hard disk installed in hard disk drive 1522. Computer program medium and computer readable medium can also refer to memories, such as main memory 1506 and secondary memory 1520, which can be semiconductor devices (e.g., DRAMs, etc.). These computer program products are means for providing software to computer system 1500.

Computer programs (also called computer control logic, programming logic, or logic) are stored in main memory 1506 and/or secondary memory 1520. Computer programs may also be received via communications interface 1540. Such computer programs, when executed, enable the computer system 1500 to implement features of the present invention as discussed herein. Accordingly, such computer programs represent controllers of the computer system 1500. Where the invention is implemented using software, the software may be stored in a computer program product and loaded into computer system 1500 using removable storage drive 1524, interface 1526, or communications interface 1540.

In another embodiment, features of the invention are implemented primarily in hardware using, for example, hardware components such as application-specific integrated circuits (ASICs) and gate arrays. Implementation of a hardware state machine so as to perform the functions described herein will also be apparent to persons skilled in the relevant art(s).

D. Conclusion

While various embodiments of the present invention have been described above, it should be understood that they have been presented by way of example only, and not limitation. It will be understood by those skilled in the relevant art(s) that various changes in form and details may be made to the embodiments of the present invention described herein without departing from the spirit and scope of the invention as defined in the appended claims. Accordingly, the breadth and scope of the present invention should not be limited by any of the above-described exemplary embodiments, but should be defined only in accordance with the following claims and their equivalents.

In the claims below, the term "audio signal being processed for playback by an audio device" should not be narrowly construed to cover only audio signals that are immediately played back after processing, but instead should be broadly construed to cover any audio signal that is processed for playback at some subsequent point in time. For example, the term should be construed to encompass audio signals that are processed and then stored or recorded on a medium for a period of time and then played back from the medium. As a further example, the term should also be construed to encompass audio signals that are processed and then transmitted to a remote entity for playback.

What is claimed is:

1. A method for limiting distortion of an audio signal being processed for playback by an audio device, comprising:
automatically updating a compression limit based on a mode or type of the audio signal;
compressing the audio signal to generate a compressed audio signal having a level that does not exceed the compression limit; and
soft clipping the compressed audio signal to generate a soft-clipped audio signal having a level that does not exceed a soft clipping limit, wherein the compression limit exceeds the soft clipping limit.

2. The method of claim 1, further comprising:
passing the audio signal through a shaping filter prior to compressing the audio signal, wherein passing the audio signal through a shaping filter comprises modifying the level of selected frequency components of the audio signal.

3. The method of claim 2, wherein passing the audio signal through a shaping filter comprises:
passing the audio signal through a high pass filter that attenuates selected lower frequency components of the audio signal.

4. The method of claim 3, wherein passing the audio signal through a high pass filter comprises:
passing the audio signal through a dynamic high pass filter that attenuates selected lower frequency components of the audio signal, wherein the amount of attenuation applied to the selected lower frequency components corresponds to a level of the audio signal prior to compressing the audio signal.

5. The method of claim 1, wherein compressing the audio signal comprises:
calculating the average power of a segment of the audio signal;
applying no compression to the segment if the average power of the segment does not exceed a first threshold;
applying limited compression to the segment if the average power of the segment exceeds the first threshold but does not exceed a second threshold that is greater than the first threshold, wherein the limited compression is characterized by a constant slew rate; and
applying unlimited compression to the segment to maintain the level of the audio signal at the compression limit if the average power of the segment exceeds the second threshold.

6. The method of claim 1, wherein soft clipping the compressed audio signal comprises:
determining the magnitude of a sample of the audio signal;
applying no attenuation to the sample if the magnitude of the sample does not exceed a first bound;
attenuating the sample in accordance with a smoothing function if the magnitude of the sample exceeds a first bound but does not exceed a second bound that is greater than the first bound; and
attenuating the sample to the soft clipping point if the magnitude of the sample exceeds the second bound.

7. A system for limiting distortion of an audio signal being processed for playback by an audio device, comprising:
signal shaping logic configured to update at least one of a compression limit and a soft clipping limit based on a mode or type of the audio signal;
a compressor, executed by at least one processor, configured to compress the audio signal to generate a compressed audio signal having a level that does not exceed the compression limit, the compressor being configured to calculate the average power of a segment of the audio signal, to apply no compression to the segment if the average power of the segment does not exceed a first threshold, to apply limited compression to the segment if the average power of the segment exceeds the first threshold but does not exceed a second threshold that is greater than the first threshold, wherein the limited compression is characterized by a constant slew rate, and to apply unlimited compression to the segment to maintain the level of the audio signal at the compression limit if the average power of the segment exceeds the second threshold; and
a soft clipper configured to soft clip the compressed audio signal to generate a soft-clipped audio signal having a level that does not exceed the soft clipping limit, wherein the compression limit exceeds the soft clipping limit.

8. The system of claim 7, further comprising:
a shaping filter configured to modify the level of selected frequency components of the audio signal prior to compression of the audio signal by the compressor.

9. The system of claim 8, wherein the shaping filter comprises a high pass filter configured to attenuate selected lower frequency components of the audio signal.

10. The system of claim 9, wherein the high pass filter comprises a dynamic high pass filter that is configured to attenuate the selected lower frequency components of the audio signal, wherein the amount of attenuation applied to the selected lower frequency components corresponds to the level of the audio signal.

11. The system of claim 7, wherein the soft clipper is configured to determine the magnitude of a sample of the audio signal, to apply no attenuation to the sample if the magnitude of the sample does not exceed a first bound, to attenuate the sample in accordance with a smoothing function if the magnitude of the sample exceeds a first bound but does not exceed a second bound that is greater than the first bound, and to attenuate the sample to the soft clipping point if the magnitude of the sample exceeds the second bound.

12. A method for limiting distortion of an audio signal being processed for playback by an audio device, comprising:
automatically updating a compression limit based on a mode or type of the audio signal;
passing the audio signal through a shaping filter that modifies the level of selected frequency components of the audio signal, thereby producing a shaped audio signal;
compressing the shaped audio signal to generate a compressed audio signal that does not exceed the compression limit; and
limiting the compressed audio signal to generate a limited audio signal having a level that does not exceed a clipping limit, wherein the compression limit exceeds the clipping limit.

13. The method of claim 12, wherein limiting the compressed audio signal to generate a limited audio signal comprises soft clipping the compressed audio signal.

14. The method of claim 12, wherein limiting the compressed audio signal to generate a limited audio signal comprises hard clipping the compressed audio signal.

15. The method of claim 12, wherein passing the audio signal through a shaping filter that modifies the level of selected frequency components of the audio signal comprises passing the audio signal through a high pass filter that attenuates selected lower frequency components of the audio signal.

16. The method of claim 15, wherein passing the audio signal through a high pass filter that attenuates selected lower frequency components of the audio signal comprises:
passing the audio signal through a dynamic high pass filter that attenuates selected lower frequency components of the audio signal, wherein the amount of attenuation applied to the selected lower frequency components corresponds to the level of the audio signal.

17. A system for limiting distortion of an audio signal being processed for playback by an audio device, comprising:
signal shaping logic configured to update at least one of a compression limit and a soft clipping limit based on a mode or type of the audio signal;
a shaping filter configured to modify the level of selected frequency components of the audio signal, thereby producing a shaped audio signal;
a compressor, executed by at least one processor, configured to compress the shaped audio signal to generate a compressed audio signal having a level that does not exceed the compression limit, the compressor being configured to calculate the average power of a segment of the audio signal, to apply no compression to the segment if the average power of the segment does not exceed a first threshold, to apply limited compression to the segment if the average power of the segment exceeds the first threshold but does not exceed a second threshold that is greater than the first threshold, wherein the limited compression is characterized by a constant slew rate, and to apply unlimited compression to the segment to maintain the level of the audio signal at the compression limit if the average power of the segment exceeds the second threshold; and
a limiter configured to limit the compressed audio signal to generate a limited audio signal having a level that does not exceed the clipping limit, wherein the compression limit exceeds the clipping limit.

18. The system of claim 17, wherein the limiter comprises a soft clipper configured to soft clip the compressed audio signal.

19. The system of claim 17, wherein the limiter comprises a hard clipper configured to hard clip the compressed audio signal.

20. The system of claim 17, wherein the shaping filter comprises a high pass filter that is configured to attenuate selected lower frequency components of the audio signal.

21. The system of claim 20, wherein the high pass filter comprises a dynamic high pass filter that is configured to attenuate selected lower frequency components of the audio signal, wherein the amount of attenuation applied to the selected lower frequency components corresponds to the level of the audio signal.

* * * * *